(12) United States Patent
Kiihamäki

(10) Patent No.: US 6,930,366 B2
(45) Date of Patent: Aug. 16, 2005

(54) METHOD FOR FORMING A CAVITY STRUCTURE ON SOI SUBSTRATE AND CAVITY STRUCTURE FORMED ON SOI SUBSTRATE

(75) Inventor: Jyrki Kiihamäki, Helsinki (FI)

(73) Assignee: Valtion Teknillinen Tutkimuskeskus, Vtt (FI)

( * ) Notice: Subject to any disclaimer, the term of this patent is extended or adjusted under 35 U.S.C. 154(b) by 0 days.

(21) Appl. No.: 10/491,193

(22) PCT Filed: Sep. 27, 2002

(86) PCT No.: PCT/FI02/00772

§ 371 (c)(1),
(2), (4) Date: Mar. 31, 2004

(87) PCT Pub. No.: WO03/030234

PCT Pub. Date: Apr. 10, 2003

(65) Prior Publication Data

US 2004/0248376 A1 Dec. 9, 2004

(30) Foreign Application Priority Data

Oct. 1, 2001 (FI) .............................. 20011922

(51) Int. Cl.⁷ .............................. H01L 29/84
(52) U.S. Cl. ........................ 257/414; 438/48
(58) Field of Search ................. 257/414, 415, 257/416, 417, 418, 419, 420; 438/48, 49, 50, 51, 52, 53, 54, 55

(56) References Cited

U.S. PATENT DOCUMENTS 5,510,276 A * 4/1996 Diem et al.
5,690,841 A   11/1997 Elderstig
6,093,330 A    7/2000 Chong et al.
6,171,979 B1   1/2001 Aoi

FOREIGN PATENT DOCUMENTS

EP    1 077 475 A2   2/2001
JP    2000-124465 A   4/2000

* cited by examiner

Primary Examiner—Nathan J. Flynn
Assistant Examiner—Kevin Quinto
(74) Attorney, Agent, or Firm—Birch, Stewart, Kolasch & Birch, LLP

(57) ABSTRACT

The present publication discloses a method for forming cavities in prefabricated silicon wafers comprising a first silicon layer (1), a second monocrystalline silicon layer, or a so-called structural layer (3), oriented substantially parallel with said first silicon layer (1) and an insulating layer (2) situated between said first and second layers (1, 3). According to the method, in at least one of the conducting silicon layers (1, 3) are fabricated windows (4) extending through the thickness of the layer, and cavities are etched in the insulating layer (2) by means of etchants passed to the layer via said fabricated windows (4). According to the invention, subsequent to the fabrication step of the windows (4) and prior to the etching step, a thin porous layer (5) is formed on the surface to be processed such that the etchants can be passed through said porous layer into said cavities (6) being etched and, after the cavities (6) are etched ready, at least one supplementary layer (7) is deposited in order to render to the material of said porous layer impermeable to gases.

6 Claims, 3 Drawing Sheets

METHOD FOR FORMING A CAVITY STRUCTURE ON SOI SUBSTRATE AND CAVITY STRUCTURE FORMED ON SOI SUBSTRATE

The invention relates to a method according to the preamble of claim 1 for forming a cavity structure on an SOI substrate.

The invention also relates to a cavity structure formed on an SOI substrate.

In the recent times, conventional surface and bulk micromechanical methods have been rivaled by the so-called SOI—(Silicon-on-Insulator) micromechanics. This technology is based on wafer bonding combined with the latest silicon dry-etch techniques and utilization of a sacrificial oxide layer known from the art of surface micromechanics.

In its simplest form a SOI component is fabricated by patterning etch-access windows on the structural layer of a SOI substrate for etching away the sacrificial layer. Thereupon, the sacrificial oxide layer is etched using concentrated hydrofluoric acid (HF). One of the greatest problems in this type of SOI micromechanics arises in the fabrication of the conductor patterns. Fabrication of the conductor pattern prior to the HF etching requires that the metallization is resistant to the etching attack imposed by HF, while on the other hand fabrication of the metallization after the HF etching step frequently generates patterning problems due to the elevated component topography. A further adversary arises from the plural adherence complications associated with smooth surfaces.

One conventional solution to the manufacturing problems of SOI micromechanical devices is offered by the use of preprocessed substrate wafers described in a reference publication [1]. Herein, the patterning of the cavities takes place prior to the fabrication (by bonding, thinning and polishing) of the SOI substrate wafer. Pre-patterning may complicate the SOI substrate bonding and, moreover, the substrate wafer may crack after bonding during the thinning step, for instance. In any case, the bonding step limits the scope of different cavity geometries applicable thereafter. Furthermore, the bending of silicon during the thinning step causes the thickness of the structural layer remaining over the cavities to become uneven as described in reference publication [2]. The internal pressure of a sealed cavity cannot be controlled accurately inasmuch as the substrate material may release gas into the cavity during the high-temperature treatment steps carried out after bonding.

Moreover, further processing of a prefabricated SOI substrate wafer needs two-sided alignment or the fabrication of complicated alignment patterns on the surface to be processed.

It is an object of the invention to provide a novel type of method capable of over-coming the problems of the prior art techniques described above.

The goal of the invention is achieved by way of, after the fabrication of the etch-access windows and before etching with HF (hydrofluoric acid), forming onto the surface to be processed a thin layer of porous polysilicon through which the etching is carried out. Subsequent to etching, onto the porous polysilicon layer is formed a second polysilicon layer that hermetically seals the cavities. Instead of polysilicon, any other sealing material may be used that can be deposited sufficiently conformally.

More specifically, the method according to the invention is characterized by what is stated in the characterizing part of claim 1.

Furthermore, the cavity structure according to the invention is characterized by what is stated in the characterizing part of claim 4.

The invention offers significant benefits.

The invention makes it possible to avoid a plurality of the problems hampering a simple SOI process. Basically, the sealed cavities are formed on the SOI substrate prior to metallization of the component and the surface of the wafer after completion of the cavity fabrication steps is planar thus facilitating a wide scope of further processing.

The method according to the invention can be used in the fabrication of almost any kind of SOI micromechanical component. By virtue of the invention, the process steps subsequent to the sacrificial layer etching become substantially easier, whereby also the process yield increases. The completion of the cavities leaves a planar surface that is suitable for further processing by a greater number of process equipment and methods than the elevated-topography surface of SOI substrate wafers processed by prior-art methods.

In certain cases, the method according to the invention entirely replaces preprocessing [1] described for SOI substrate wafers, whereby the present invention can over-come the problems occurring in bonding and thinning of wafers with preprocessed cavities. This is because the cavities processed in the novel method do not affect the thickness of the structural layer on the SOI substrate in the same fashion as in the thinning of substrate wafers having the cavities prefabricated thereon prior to bonding.

The cavities can now be formed and sealed using methods compatible with known integrated-circuit technologies. Hence, the planar surface remaining after the sealing of the cavities facilitates the integration of active circuits on the same wafer [4].

The invention also entirely replaces wet etching that conventionally is made on the sacrificial layer after metallization thus permitting a very long etch time in etching with HF. Furthermore, metallization need not be limited to the use of HF-resistant metal films alone. Also conductor pattern metallization may now be applied on a planar surface.

Due to the sealed structure of cavities, further processing may be made entirely free from the risk of liquids accessing the finished cavities, whereby the stiction problems of the internal structures are reduced. If necessary, the stick-on risk may further be diminished by complementing the structures with anti-stiction bumps.

The method makes it possible to manufacture released micromechanical structures (e.g., laterally moving electrostatic actuators) whose final release is performed using dry-etching. The structures may be designed such that the supplementary anchor areas used as support structures during processing may be located outside the active structure.

It is further possible to use the method for fabricating sealed micromechanical structures with a controlled internal pressure, such as pressure and ultrasound transducers, for instance, as well as vertically moving electrostatic actuators.

In the following, the invention will be examined with the help of exemplifying embodiments illustrated in the appended drawings in which FIG. 1 is a longitudinally sectional side elevation view of a process step in a first embodiment of the method according to the invention;

Figure 1:
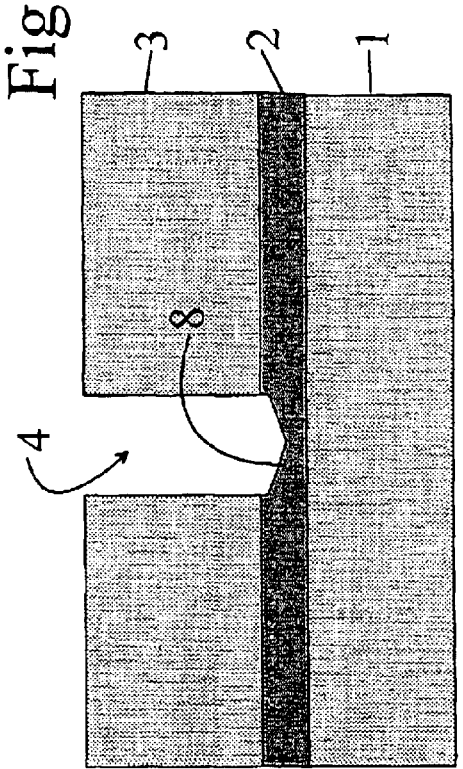
Figure 2:
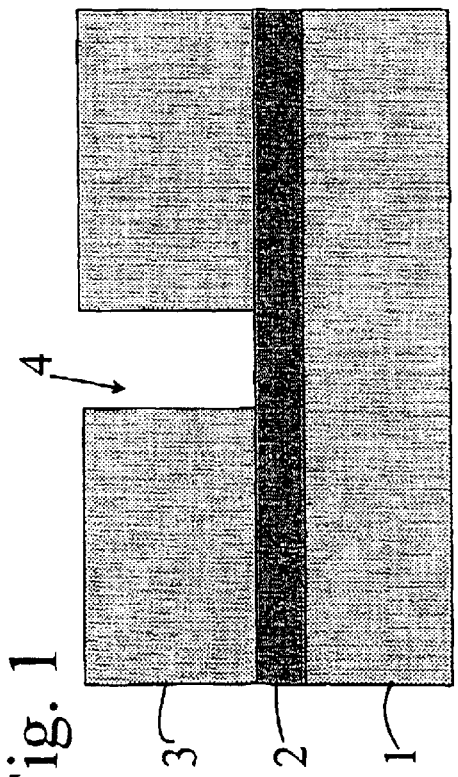
FIG. 2 is a similar view of a later process step of the method illustrated in FIG. 1.
Figure 3:
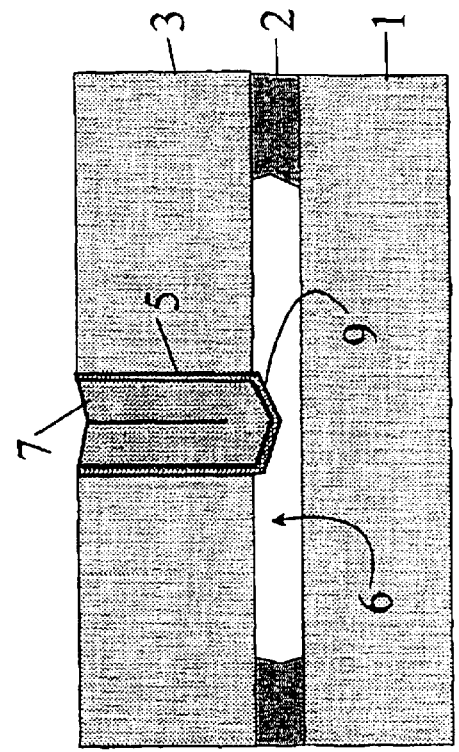
FIG. 3 is a longitudinally sectional side elevation view of a process step in a second embodiment of the method according to the invention, whereby the process step represents a variation with the sacrificial oxide layer having etched thereon a shallow well that later is utilized to form an anti-stiction bump.
Figure 4:
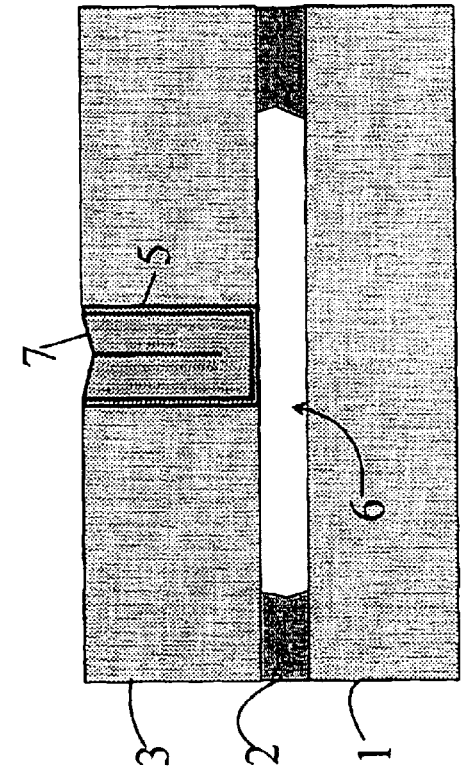
FIG. 4 is a similar view of a later process step of the method illustrated in FIG. 3.
Figure 5:
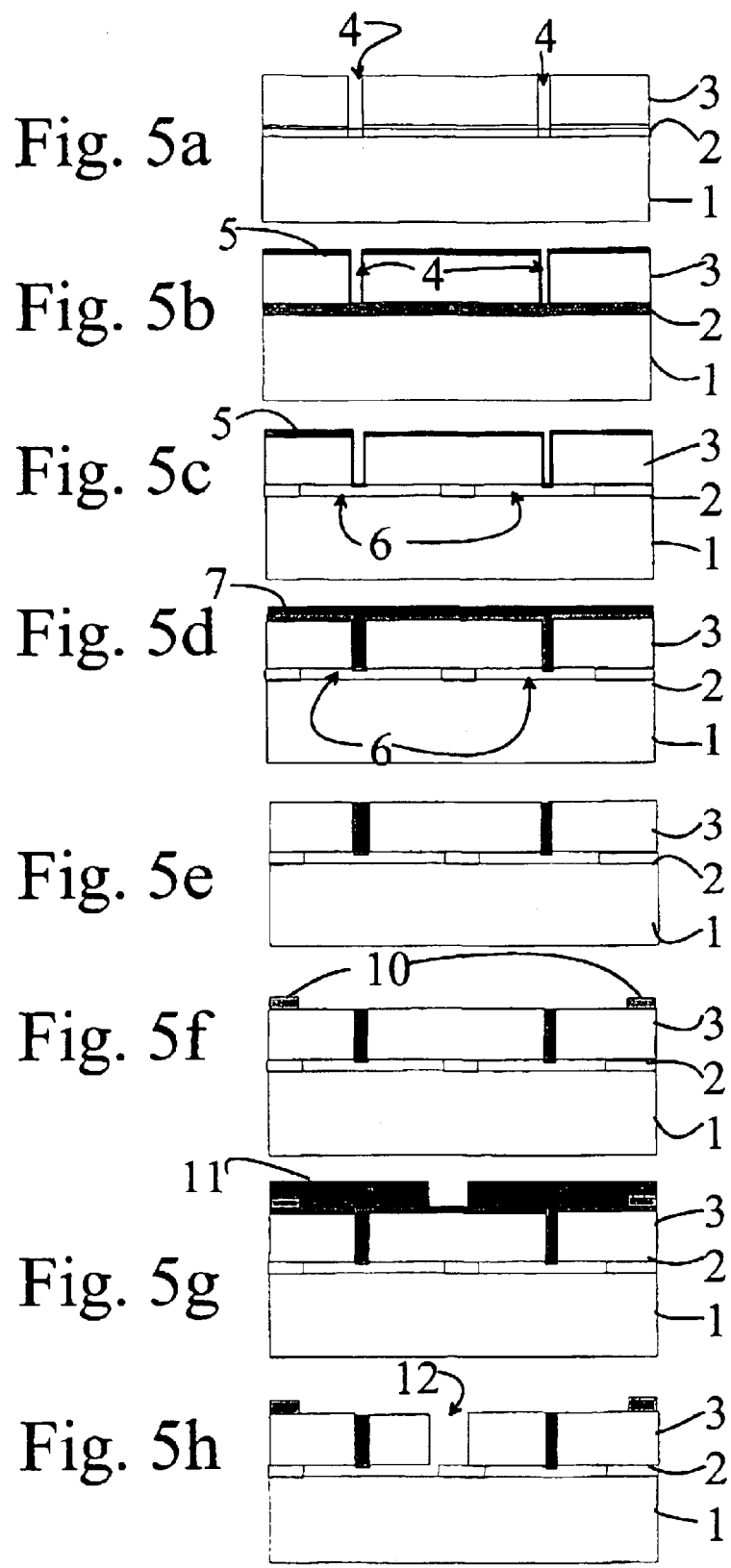
Figure 6:
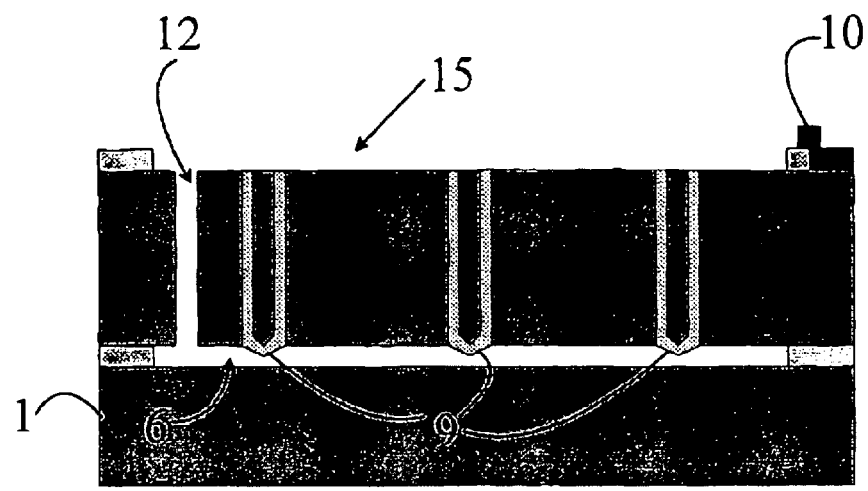
Figure 7:
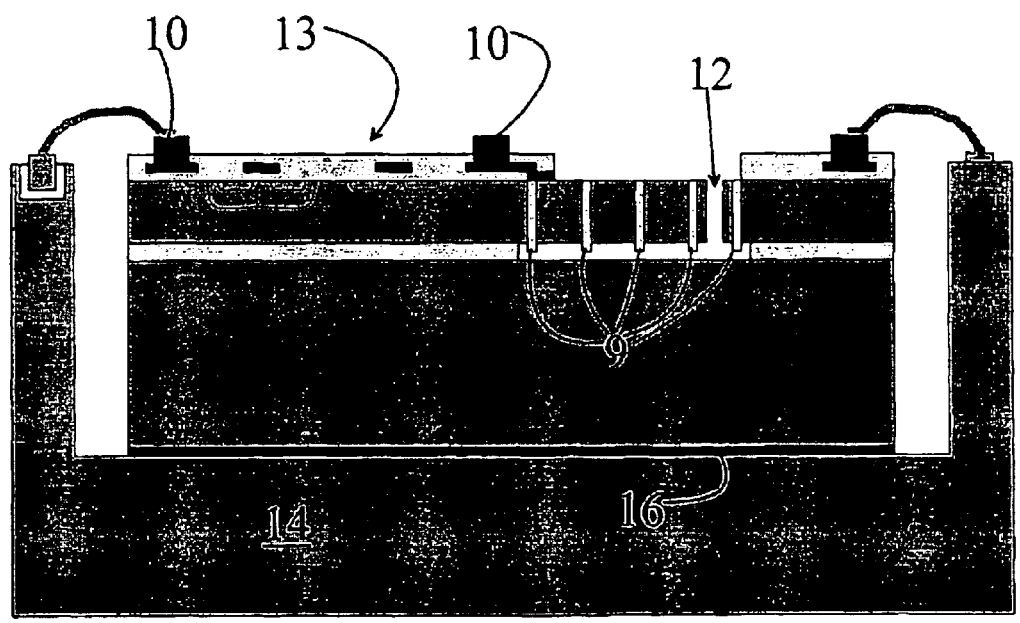

FIGS. 5a–5h are longitudinally sectional side elevation views of a third embodiment of the method according to the invention, whereby the process steps of FIGS. 1–4 are represented in more detail so that alternative embodiments of the structure of FIG. 5a are shown in enlarged scale in FIGS. 1 and 3, while respectively alternative embodiments of the structure of FIG. 5e are shown in enlarged scale in FIGS. 2 and 4;

FIG. 6 is a longitudinally sectional side elevation view of a sensor structure fabricated according to the invention; and FIG. 7 is a longitudinally sectional side elevation view of a sensor structure fabricated according to the invention with integrated electronics embedded in an encapsulating substrate structure.

Next, the fabrication method according to the invention is described by making reference to FIGS. 1–4.

Accordingly, an SOI substrate comprises a conducting monocrystalline silicon layer 1, an insulating layer 2 formed thereupon and a second conducting monocrystalline silicon layer called a structural layer 3 which is deposited on the insulating layer 2. Layers 1, 2 and 3 are substantially parallel to each other. Serving as a substrate, layer 1 is made substantially thick in relation to the thickness of layer 3. Typically, insulating layer 2 is silicon dioxide. As shown in FIGS. 1 and 3, conventional etch-access windows 4 are made in the structural layer 3 of the SOI substrate by anisotropic etching. Thereupon a thin film 5 is deposited having microscopic pores that are permeable to the chemical composition such as hydrofluoric acid used for etching the sacrificial layer and, conversely, permit the removal of the etched-away sacrificial material. The thin film 5 may be of polycrystalline silicon, for instance.

The etching of the material, typically silicon dioxide, acting as the sacrificial layer 2 takes place via the porous (hole-perforated) thin film 5. After etching and drying of the component structures, a cavity 6 typically having a partial vacuum in its interior is formed in the beginning of the gas-phase layer deposition process that plugs the pinholes of the thin film. This step forms a hermetic seal 7 generally implemented by depositing a polysilicon layer 7. The sealed layer 5, 7 prevents the access of gas molecules and liquids into the interior of cavities 6 during later process steps.

The polysilicon layers 5 and 7, also called the seal layers, can be removed from the horizontal surfaces called the process layers by means of plasma etching, whereby the etch process can be completed by reaching, e.g., a silicon dioxide layer or by stopping the etch process after the lapse of a given etch time. The seal layers may also be removed by other methods such as oxidization or abrasive lapping. In certain cases there may be no need for removing the seal layers.

Anti-stiction bumps 9 are formed during the process if as shown in FIGS. 3 and 4, prior to the deposition of the thin, porous silicon layer 5, the oxide of layer 2 is etched thinner at the windows, whereby the recesses 8 are opened in the oxide layer 2. During the release of the structures and in the use of the component, the bumps 9 counteract the stick-on tendency of the polished monocrystalline silicon surfaces forming the parallel horizontal walls of cavity 6. In typical sensor applications, these surfaces form the measurement electrodes of a capacitive sensor, whereby their sticting to each other might make the sensor inoperative.

Window 4 shown in FIGS. 1–4 may be a single hole, a matrix of holes, a random-pattern group of holes, a narrow slot or an array of slots, whereby the common feature in these is a cross section of the type shown in the diagrams. Typically, the window 4 has a diameter of 0.5–2 $\mu$m. The lower limit of the window size in the monocrystalline silicon layer is set by the density of pore holes in the polycrystalline layer 5, while the upper limit is set by the thickness of the polycrystalline layer 7 used for replugging the window.

The size, number and location of the etch-access windows 4 may be designed so that these parameters do not substantially affect the almost ideal mechanical qualities of the structural layer material of the SOI substrate wafer. In a component structure intended to be unplugged, all the plugs (or a desired number of the plugs) made thereto can be located outside the active area of the component or even removed entirely during the last deep-etch step of silicon.

While the thin film 7 used for plugging window 4 is typically made from polysilicon, it may alternatively be formed by a plurality of different thin-film layers.

The internal pressure of cavity 6 produced in accordance with the invention is determined by the process pressure and temperature during the replugging step of window 4. Due to the thickness of the sealing structure, the internal pressure of the cavity may be assumed to be more stable than that of cavities formed by thin-film structures alone [3]. Sealing of the cavities may also be contemplated in a deposition process operated at ambient atmospheric pressure.

As illustrated in FIGS. 5a–5h, the process according to the invention can be implemented by way of performing, e.g., the following succession of steps:

FIG. 5a: Patterning of structural layer 3 of SOI substrate wafer (with etch-access windows).

FIG. 5b: Deposition of porous polysilicon layer 5.

FIG. 5c: Etching of sacrificial layer 2 (using HF, for instance).

FIG. 5d: Plugging of etch-access windows 4 with polysilicon 7.

FIG. 5e: Etchback of polysilicon 7 to make the process surface of monocrystalline layer 1 planar.

FIG. 5f: Deposition of metallization 10 and patterning thereof.

FIG. 5g: Patterning of structural layer 3 of SOI substrate wafer, whereby the active area is delineated and its structure is defined with the help of photoresist 11.

FIG. 5h: Etching of structural layer 3 of SOI substrate wafer in order to make, e.g., the etch-access windows 12 for the release of cantilever beam elements and to remove photoresist 11 (released cantilever beam shown on the left side and sealed cavity on the right side).

In the implementation of the invention, the directions shown in the diagrams are irrelevant allowing the process to be carried out having the SOI substrate wafer oriented in any desired direction. In the context of this patent application, the surface to be processed that in the exemplifying embodiments is the top surface of layer 3 is called the process surface.

FIG. 6 shows in an enlarged scale the details of a structure implemented according to the invention. Via the etch-access window 12 from the substrate material is released a beam member 15 that may act as an active element in an acceleration sensor, for instance. In cooperation with the upper surface of conducting layer 1, the bottom surface of conducting beam 15 forms an electrode pair whose capacitance can be measured to sense acceleration, for instance. Bump structures 9 prevent the movable sensor element from sticting on the surface of layer 1 under strong acceleration or, respectively, when overdriven by an electrical signal. Contact metallization 10 is deposited on the upper surface of the sensor component.

FIG. 7 shows the top side of the sensor with electronics 13 integrated thereon such as, e.g., a preamplifier, the sensor being mounted in an electrically isolated or conducting fashion 16 on an encapsulating structure 14. In principle, the material of the film structures can be selected freely from the group of materials compatible with the process. The only feature required from film 7 is, however, that it can serve as a hermetic seal.

Inasmuch as the conductivity of silicon can vary from an almost insulating type to a highly conducting type (typically being of the high-conductivity type in micromechanical sensors, but of extremely low-conductivity type in radiation sensors and somewhere therebetween in integrated structures), it is appropriate to denote layer 3 discussed earlier simply as a silicon layer.

In SOI substrate wafers, the silicon layers mentioned above are generally made of monocrystalline silicon. Nevertheless, the present invention may possibly be applied to polysilicon wafers or layers as well. Hence, layer 1 may be made either from monocrystalline or polycrystalline silicon without departing from the scope of the invention.

References:

1. E. H. Klaassen et al., Tranducers '95 and Eurosensors IX, "Silicon fusion bonding and deep reactive ion etching: a new technology for microstructures", Tranducers '95 and Eurosensors IX, Jun. 25–29, 1995, Stockholm, Digest of Technical Papers, Vol. 1, pp. 556–559.

2. A. Prochaska, P. Baine, S. J. N. Mitchell, H. S. Gamble, Proc. SPIE, Vol. 4174, pp. 244–255, 2000.

3. Y. Kageyama, T. Tsuchiya, H. Funabashi, and J. Sakata, J. Vac. Sci. Tech. A, Vol. 18, No. 4, pp. 1853–1858,2000.

4. M. E. McNie, D. O. King, Proc. SPIE, Vol. 3511, p. 277–285, 1998.

5. K. S. Lebouitz, R. T. Howe, A. P. Pisano, "Permeable polysilicon etch-access windows for microshell fabrication", Tranducers '95 and Eurosensors IX, Jun. 25–29, 1995, Stockholm, Digest of Technical Papers, Vol. 1, pp. 224–227.

What is claimed is:

1. A method for forming cavities in prefabricated silicon wafers comprising a first silicon layer (1), a second monocrystalline silicon layer, or a so-called a structural layer (3), oriented substantially parallel with said first silicon layer (1) and an insulating layer (2) situated between said first and second layers (1, 3), the method comprising the steps of fabricating in at least one of said second silicon layers (1, 3) windows (4) extending through the thickness of said layer, and etching cavities in said insulating layer (2) by means of etchants passed to the layer via said fabricated windows (4), characterized in that subsequent to the fabrication step of said windows (4) and prior to said etching step, a thin porous layer (5) is formed on the surface to be processed such that the etchants can be passed through said porous layer into said cavities (6) being etched, and after said cavities (6) are etched ready, at least one supplementary layer (7) is deposited in order to render to the material of said porous layer impermeable to gases.

2. The method of claim 1, characterized in that in conjunction with the fabrication of said windows (4) said insulating layer (2) is additionally processed to include a recess (8) suited for forming in conjunction with the deposition of said layers (5 and 7) a bump (9) extending into the interior of said cavity (6).

3. The method of claim 1 or 2, characterized in that said layer (1, 3), wherein said windows (4) are formed, is processed to have a substantially planar processed surface whereon integrated components (13) and metallization can be fabricated.

4. A cavity structure in a prefabricated silicon wafer comprising a first silicon layer (1), a second monocrystalline silicon layer, or a so-called structural layer (3), oriented substantially parallel with said first silicon layer (1) and an insulating layer (2) situated between said first and second layers (1, 3), wherein the cavity structure (6) is formed in said insulating layer (2) that is substantially situated between said first silicon layer (1) and said second silicon layer (3) and each one of the thus formed cavities (6) is delineated by at least one sealed window structure (4, 5, 7), characterized in that said sealed window structure (4, 5, 7) has at its end opening into said cavity (6) at least one porous layer (5) such that the etchants may be passed therethrough during a fabrication step into said cavities (6) being etched, and said sealed window structure (4, 5, 7) has at least one supplementary layer (7) deposited thereon in order to render to the material of said porous layer impermeable to gases.

5. The cavity structure of claim 4, characterized in that said window structure (4, 5, 7) is suitable for forming a bump (9) extending into the interior of said cavity (6).

6. The cavity structure of claim 4 or 5, characterized in that the layer (1, 3) wherein said window structure (4, 5, 7) is formed is processed to have a substantially planar processed surface whereon integrated components (13) and metallization can be fabricated.

* * * * *